(12) United States Patent
Ikehashi

(10) Patent No.: US 6,888,770 B2
(45) Date of Patent: May 3, 2005

(54) SEMICONDUCTOR MEMORY DEVICE

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/617,391

(22) Filed: Jul. 11, 2003

(65) Prior Publication Data

US 2004/0223392 A1 Nov. 11, 2004

(30) Foreign Application Priority Data

May 9, 2003 (JP) ........................................ 2003-132090

(51) Int. Cl.[7] ............................................. G11C 7/00
(52) U.S. Cl. ...................................... 365/205; 365/177
(58) Field of Search .................................. 365/205, 177

(56) References Cited

U.S. PATENT DOCUMENTS

| | | | |
|---|---|---|---|
| 4,658,159 A | | 4/1987 | Miyamoto ................... 327/52 |
| 4,984,207 A | * | 1/1991 | Tateno et al. ............... 365/208 |
| 5,036,231 A | * | 7/1991 | Kanbara ...................... 327/55 |
| 5,371,703 A | | 12/1994 | Miyamoto ............. 365/185.21 |
| 6,538,916 B2 | | 3/2003 | Ohsawa ...................... 365/149 |

OTHER PUBLICATIONS

T. Shino, et al., IEEE Translations on Electron Devices, vol. 49, No. 3, pp. 414–421, "Analysis on High–Frequency Characteristics Of SOI Lateral BJTs with Self–Aligned External Base For 2–GHz RF Applications", Mar. 2002.

* cited by examiner

Primary Examiner—M. Tran
(74) Attorney, Agent, or Firm—Oblon, Spivak, McClelland, Maier & Neustadt, P.C.

(57) ABSTRACT

A semiconductor memory device includes: a device substrate having a semiconductor layer separated by a dielectric layer from a base substrate; a memory cell array having a plurality of memory cells formed and arranged on the semiconductor layer of the device substrate, each the memory cell having a MOS transistor structure with a body in an electrically floating state to store data based on a majority carrier accumulation state of the body; and a sense amplifier circuit configured to perform data read out of the memory cell array, the sense amplifier circuit including a bipolar transistor for performing current amplification of a memory cell selected during data reading.

14 Claims, 15 Drawing Sheets

FIG. 16
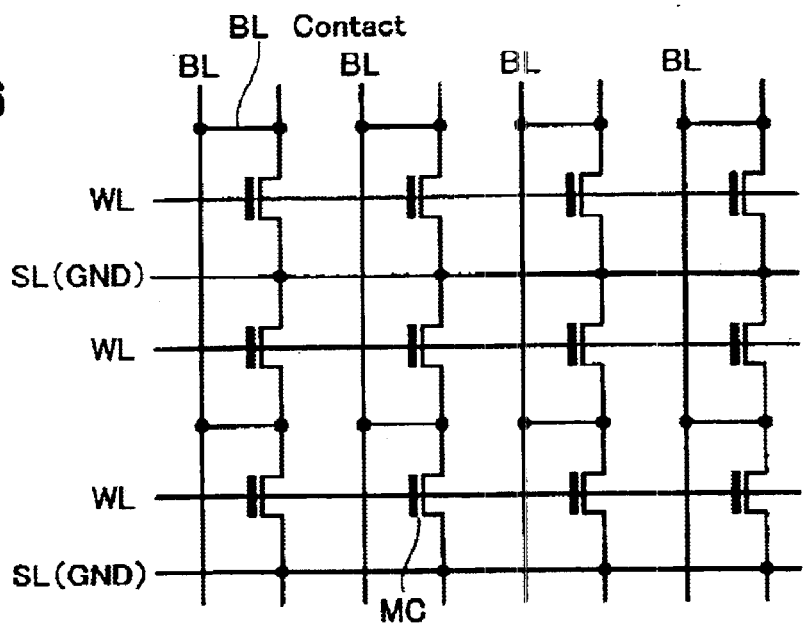
FIG. 17   "1" WRITE
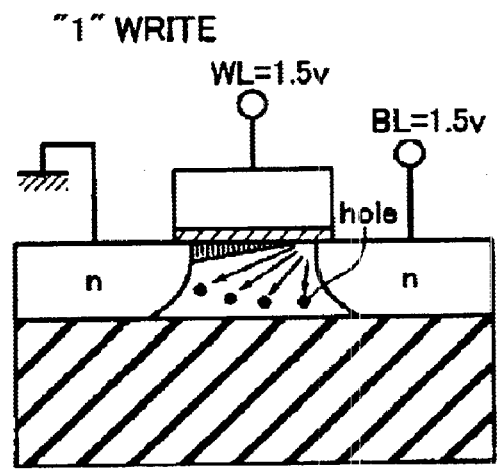
FIG. 18   "0" WRITE
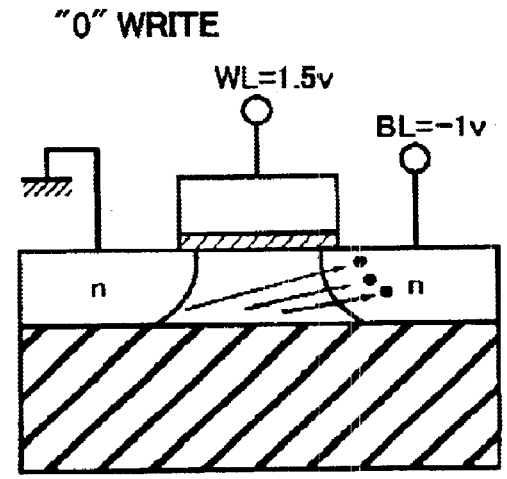

SEMICONDUCTOR MEMORY DEVICE

CROSS-REFERENCE TO RELATED APPLICATION

This application is based upon and claims the benefit of priority from the prior Japanese Patent Application No. 2003-132090, filed on May 9, 2003, the entire contents of which are incorporated herein by reference.

BACKGROUND OF THE INVENTION

1. Field of the Invention

This invention relates to a semiconductor memory device of the type having a one-transistor/one-cell structure as formed on a silicon-on-insulator (SOI) substrate.

2. Description of Related Art

Recently, for the purpose of alternative use or replacement of conventional dynamic random access memory (DRAM) devices, a semiconductor memory device that has a more simplified cell structure for enabling achievement of dynamic storability has been proposed. This type of memory is disclosed, for example, in Takashi Ohsawa et al., "Memory Design Using One-Transistor Gain Cell on SOI", ISSCC Digest of Technical Papers, 2002, pp. 152–153. A memory cell is structured from a single transistor which has an electrically floating body (channel body) as formed on a silicon on insulator (SOI) substrate. This memory cell offers two-value data storing capabilities while regarding the state that an excess number of majority carriers are accumulated or stored in the body as a first data state (for example, logic "1" data) and letting the state that the excessive majority carriers are drawn out from the body be as a second data state (e.g. logic "0" data).

The one-transistor memory cell of the type stated above will be referred to hereinafter as a floating-body cell (FBC). A semiconductor memory using FBCs will be called the "FBC memory". The FBC memory makes use of no capacitors unlike currently available standard DRAM chips so that this one-transistor/no-capacitor or "capacitor-less" cell memory is simpler in memory cell array structure and smaller in unit cell area than ever before. Thus FBC memory is readily scalable in cell structure and advantageously offers much enhanced on-chip integration capabilities.

For writing logic "1" data in the FBC memory, impact ionization near the drain of a memory cell is utilized. More specifically, while giving appropriate bias conditions for permitting flow of a significant channel current in the memory cell, cause majority carriers that are produced by impact ionization be stored in the floating body. Writing logic "0" data is performed by setting a PN junction between the drain and the body in a forward bias state to thereby release the body's majority carriers toward the drain side.

A difference in the carrier storage states of such floating body appears as a difference in threshold voltage of a transistor. Thus it is possible to determine or sense whether the resultant read data is a logic "0" or "1" by detecting whether an appreciable cell current is present or absent— alternatively, whether the cell current is large or small in magnitude—while applying a prespecified read voltage to the gate of a presently selected memory cell. Excess majority carriers of the body would be drawn out through the PN junction between the source and drain when letting the body remain unprocessed for an increased length of time period. Thus a need is felt to perform refresh operations at constant time intervals as in ordinary DRAMs.

For improving the characteristics of the FBC memory, it has also been proposed to employ in addition to the main gate of a memory cell an auxiliary gate which is capacitively coupled to the floating body. This approach has been disclosed, for example, in Published Japanese Patent Application Nos. 2002-246571 and 2003-31693.

Techniques for fabricating laterally structured or "lateral-access" bipolar transistors on an SOI substrate are known, one of which is disclosed for example in IEEE Transactions on Electronic Devices, Vol. 49, No. 3, March 2002, pp. 414–421.

In semiconductor memories using bulk semiconductor, techniques are known for using bipolar transistors in sense amplifier circuitry to perform high-speed reading, some of which are found in U.S. Pat. No. 4,658,159 (assigned to Toshiba), U.S. Pat. No. 5,287,314 (to Motorola); U.S. Pat. No. 5,265,060 (Hitachi); and U.S. Pat. No. 4,839,862 (NEC). A technique for using bipolar transistors for bit-line selector circuitry is also known and is taught by U.S. Pat. No. 5,371,703 (Toshiba).

In FBC memories, the same bias relationship is used during data reading and during logic "1" data writing. Thus at the time of data readout, it should be required that the drain voltage of a presently selected memory cell is potentially lower than that at the time of logic "1" write in order to ensure that no write failures take place—in other words, no impact ionization occurs at the selected memory cell. Due to this, it is not easy to permit flow of a larg cell current during data reading and therefore to obtain increased sensitivity of sense amplifier circuitry. If it is unable to flow a large cell current, then an increased length of time must be taken for charging/discharging a bit line as connected to the drain of a memory cell. This in turn makes it impossible to perform high-speed reading operations required.

In order to achieve high-speed reading of FBC memories, it is also required to speed up the potential rise-up and fall-down of a word line used to drive the gate of a memory cell. In other words, large current drivability is required also to a row decoder which drives the word line.

SUMMARY OF THE INVENTION

A semiconductor memory device includes:
- a device substrate having a semiconductor layer separated by a dielectric layer from a base substrate;
- a memory cell array having a plurality of memory cells formed and arranged on the semiconductor layer of the device substrate, each the memory cell having a MOS transistor structure with a body in an electrically floating state of store data based on a majority carrier accumulation state of the body; and
- a sense amplifier circuit configured to perform data read out of the memory cell array, the sense amplifier circuit including a bipolar transistor for performing current amplification of a memory cell selected during data reading.

BRIEF DESCRIPTION OF THE DRAWINGS

FIG. 16 is a diagram showing an equivalent circuit of the memory cell array.

FIG. 17 is a diagram showing the principle of data "1" writing of a memory cell.

FIG. 18 is a diagram showing the principle of data "0" writing of the memory cell.

DETAILED DESCRIPTION OF THE EMBODIMENTS

Illustrative embodiments of this invention will be explained with reference to the accompanying drawings below.

Figure 12:
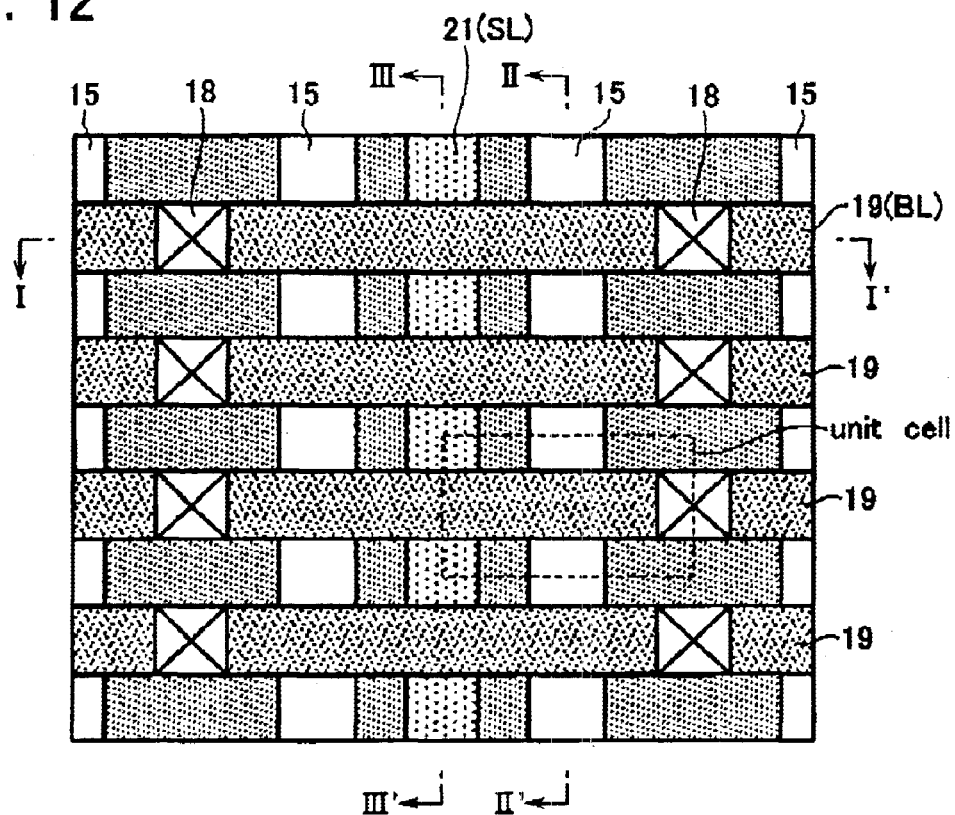
FIG. 12 is a diagram showing a plan view of a layout pattern of main part of a memory cell array.
Figure 13:
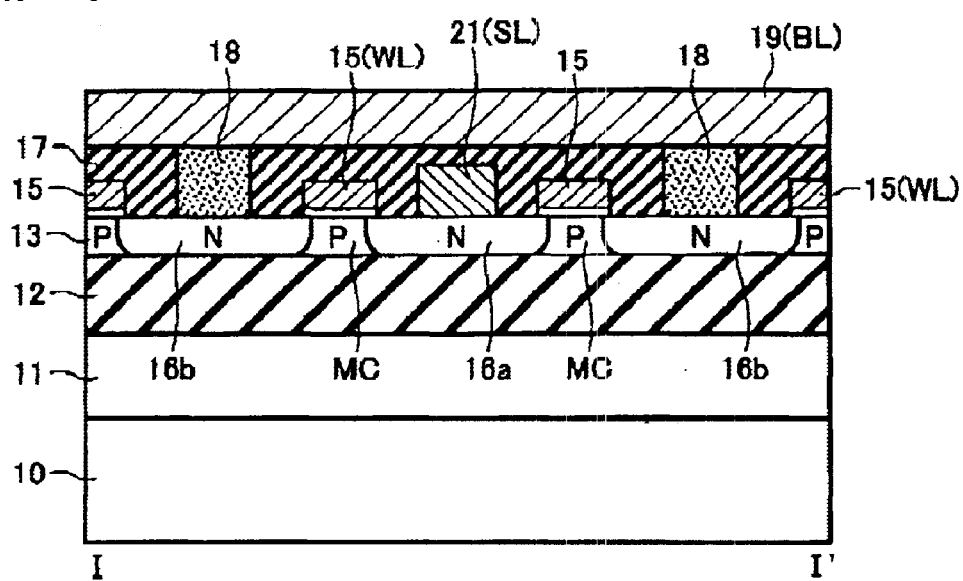
FIG. 13 is a diagram showing a sectional view of the memory cell array as taken along line I–I' of FIG. 12.

An explanation will first be given of the configuration of a memory cell array of a floating-body cell (FBC) memory device in accordance with one embodiment of the invention. FIG. 12 depicts a plan view of main part of the memory cell array, and FIGS. 13 to 15 are cross-sectional views of the cell array as taken along lines I–I', II–II' and III–III', respectively.

The FBC memory has a silicon substrate 10 of P-type conductivity serving as a base substrate. The P-type substrate 10 has a top surface in which a heavily doped N ($N^+$)-type layer 11 is formed with its surface covered or coated with an electrically insulative or dielectric film 12. This film may be a silicon oxide film or the like. On the dielectric film 12, a P-type silicon layer 13 is formed for use as an active layer which is electrically separated or isolated from substrate 10, thereby providing a silicon-on-insulator (SOI) substrate structure. On the silicon layer 13 of such SOI substrate, insulated gate electrodes 15 are formed. Each gate electrode 15 is associated with N-type source and drain diffusion layers 16a and 16b formed in silicon layer 13 to thereby constitute a memory cell MC which consists of a single N-channel metal oxide semiconductor (NMOS) transistor having an electrically floating body. This memory cell is called the floating-gate cell (FBC).

The silicon layer 13 is patterned into a plurality of stripe-shaped portions in a similar manner to bit lines (BL) 19 to be later formed. An empty space between adjacent ones of these strips is buried with an interlayer dielectric (ITL) film 14. A plurality of memory cells MC are laid out at each the stripe-patterned portions of silicon layer 13 in such a manner that a source/drain suffusion layer 16a, 16b is shared by neighboring cells. The gate electrode 15 is formed as an elongate conductive pattern which continues to span multiple memory cells MC which are arrayed in a direction crossing the bit lines (BL) 19, and is for use as one of word lines WL. The source diffusion layers 16a of memory cells are commonly connected together to a source line (SL) 21 which extends in parallel to the word lines. An ITL layer 17 is formed to cover the cell array. Bit lines 19 are disposed on this ITL layer 17. A bitline 19 is connected through a contact plug 18 to the drain diffusion layer 16b of each of linearly aligned or "queued" memory cells MC associated with the bitline 19 in the cell array.

Figure 14:
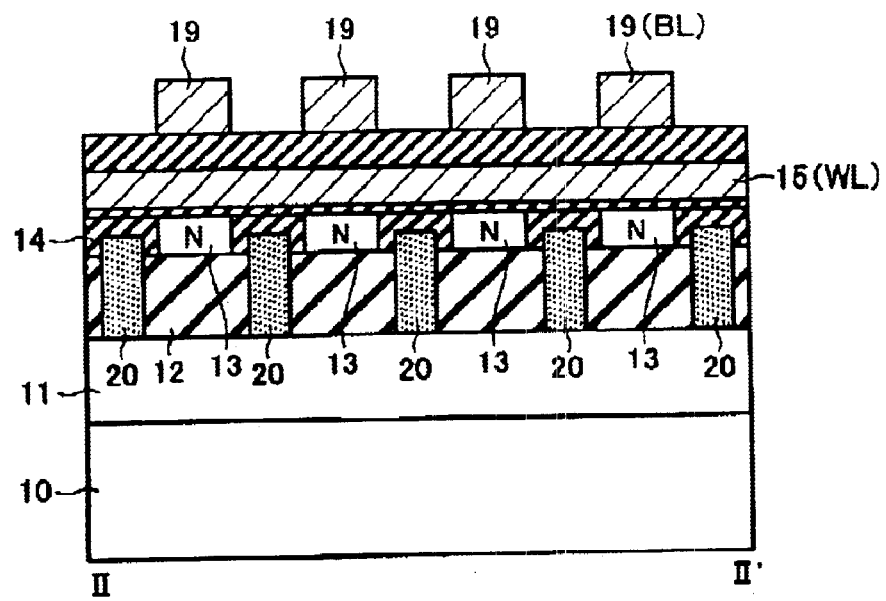
FIG. 14 is a diagram showing a sectional view taken along line II–II' of FIG. 12.
Figure 15:
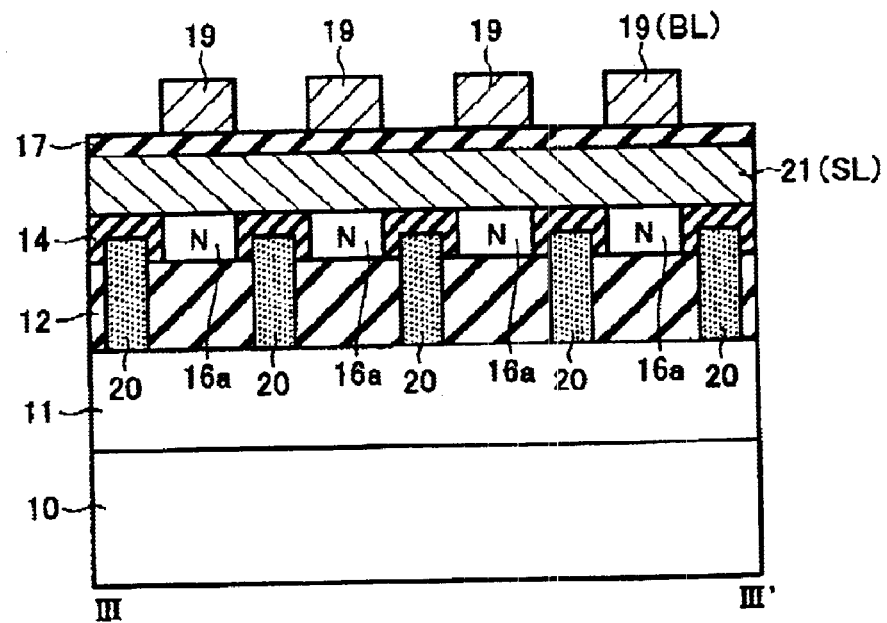
FIG. 15 is a diagram showing a sectional view along line III–III' of FIG. 12.

As better shown in FIGS. 14 and 15, laterally spaced-apart pillars 20 made of polycrystalline silicon or polysilicon are buried in the dielectric films 12 and 14 so that a pillar is between adjacent ones of the bitlines 19. The pillar 20 vertically extends to penetrate dielectric film 12 so that its lower end is in contact with the underlying $N^+$-type silicon layer 11 while letting its upper end be located within dielectric film 14 to thereby capacitively couple with the lower end of a floating body of its associated memory cell MC. This pillar 20 functions as an auxiliary gate for potential control of the memory cell body. For example, applying a negative voltage to pillar 20 through silicon layer 11 makes it possible to retain the hole accumulation or storage state (logic "1" data state) of the floating-body memory cell MC within an increased length of time period.

In this way, the memory cell array with a matrix layout of floating-body cells MC is obtained as shown in FIG. 16. Each memory cell MC consists essentially of a single transistor so that the resultant unit cell area is kept smaller as indicated by dotted lines in FIG. 12. Thus it is possible to achieve higher on-chip memory-cell integration with much increased or ultrahigh densities.

Operation principles of the FBC memory will next be explained with reference to FIGS. 17 to 20. The source line SL is constantly set at ground potential GND in any events. For logic "1" data writing, apply to a selected word line and a selected bit line a specific voltage which permits a memory cell as selected thereby to operate in a pentode region. For example as shown in FIG. 17, apply a voltage of 1.5 volts (V) to the selected wordline WL while giving a 1.5V voltage to the selected bitline BL. With this voltage application, the selected memory cell operates in the pentode region (current saturation region), and causes a channel current to flow while at the same time allowing impact ionization to occur at part near the drain of the selected cell. The impact ionization results in production of majority carriers—here, holes. These holes behave to move or drift down below the floating body and then are stored therein. This excess hole accumulation state of the body is regarded as a logic "1" data storing state.

For writing logic "0" data, a forward bias current flowable between the drain and the floating body of a memory cell is utilized. For example as shown in FIG. 18, apply a negative voltage of −1V to a presently selected bit line BL while simultaneously giving a 1.5V voltage to a selected word line WL. With such voltage application, the holes that are stored in the floating body of a selected memory cell are drawn out from the body toward the bitline BL through the forward-biased PN junction. The resulting state with no excess holes in the body is the data "0" storage state.

Figure 19:
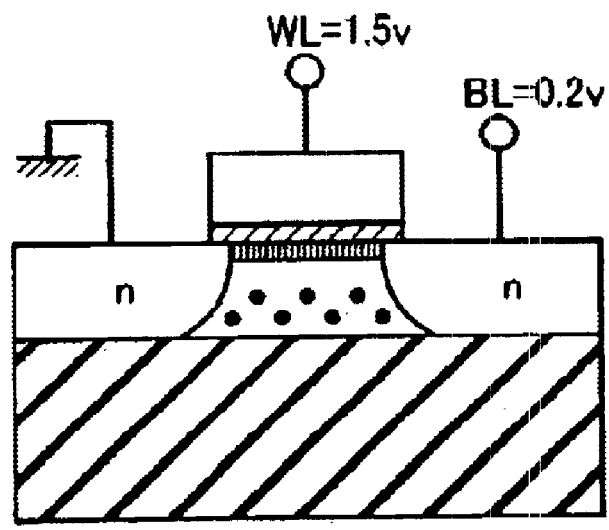
FIG. 19 is a diagram showing the principle of data readout of the memory cell.
Figure 20:
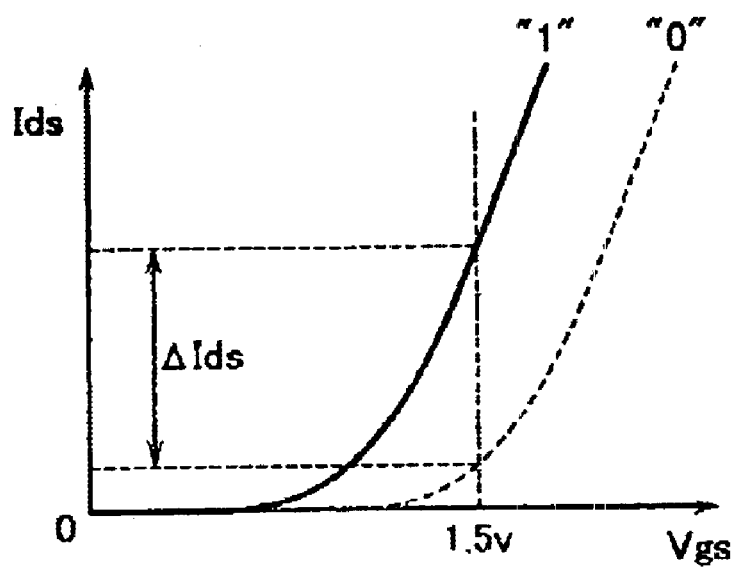
FIG. 20 is a diagram graphically showing current characteristics curves of the memory cell.

After completion of data write, the stored data is retained by applying to the wordline WL a holding voltage with the negative polarity—for example, −1.5V. Data read is done by potentially biasing the memory cell in its turn-on state which precludes occurrence of impact ionization and then detecting a cell current flowing therein. For example as shown in FIG. 19, apply a voltage of 1.5V to the selected wordline WL and apply a 0.2V voltage to the selected bitline BL. Whereby, the memory cell of interest is set in an on state within a triode operation region (linear region). The floating body's hole storage state which differs depending upon whether data "0" or "1" is stored therein becomes a difference in back-bias, which in turn leads to a difference in threshold voltage of the memory cell. Accordingly, the memory cell is different in current characteristics curve in a way depending on whether the stored data is a logic "0" or "1" as shown in FIG. 20. Thus it is possible to determine or identify whether the stored data is a logic "0" or "1" by detecting a cell current difference ΔIds between the both.

During data reading, data destruction at the selected memory cell is avoidable by utilizing the linear transistor operation region that is free from occurrence of impact ionization. Regarding non-selected memory cells, data destruction hardly occurs thereat by setting their associated wordlines WL at −1.5V and bitlines BL at 0V.

Figure 21:
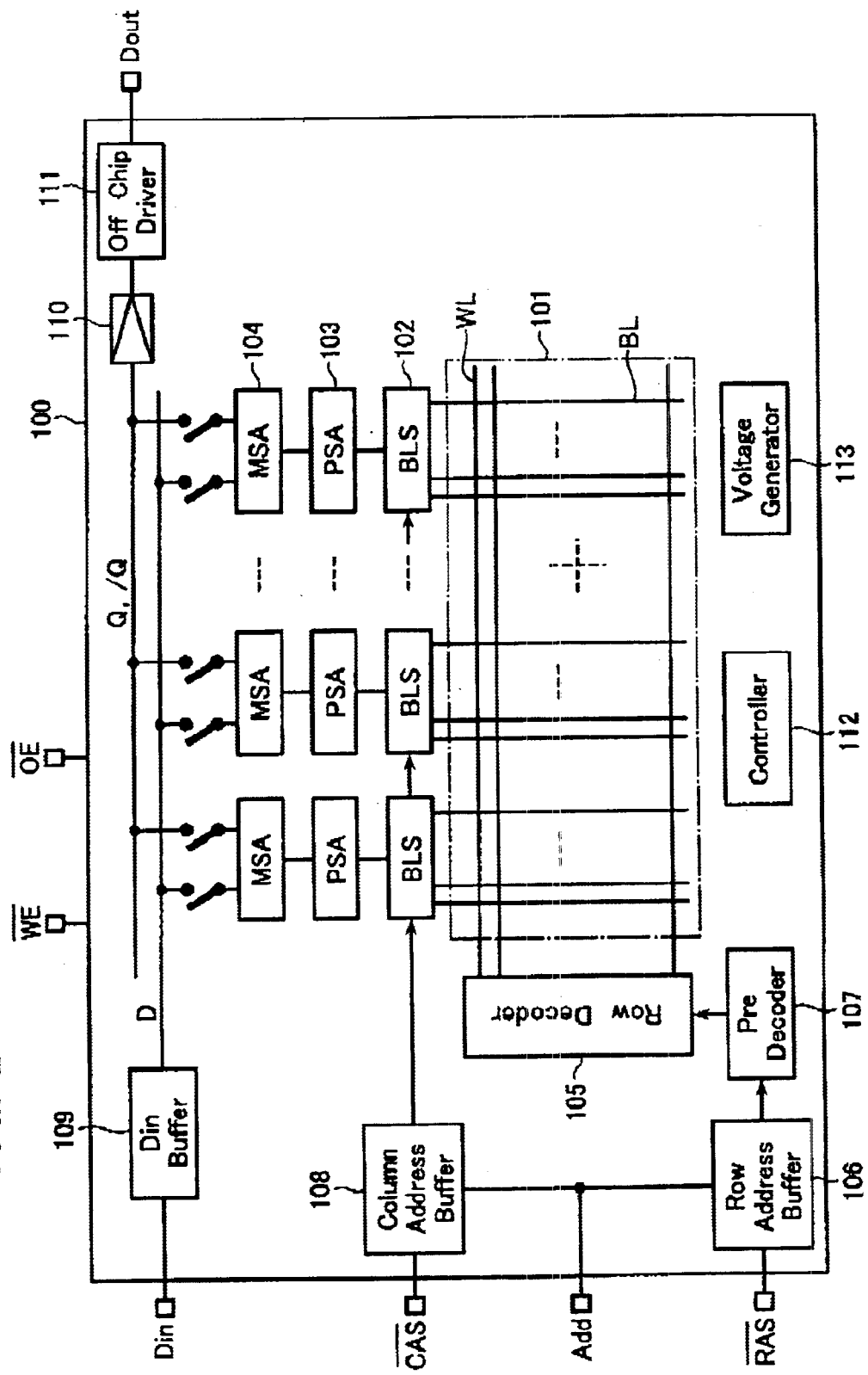
FIG. 21 is a diagram showing an arrangement of a memory chip.

Referring next to FIG. 21, there is shown an overall configuration of electrical circuitry of the FBC memory chip 100 in accordance with this embodiment. This FBC memory 100 has a memory cell array 101, which is preferably subdivided into cell units each being associated with a prespecified number of parallel bit lines BL. The bitlines SL of each cell unit are such that any one of them is selectable by a bit-line selector (BLS) circuit 102. In view of the fact that the FBC memory is aimed at successful replacement of currently available DRAM chips, the FBC memory is designed to employ address multiplexing architectures with the controllability by column address strobe (/CAS) and row address strobe (/RAS) signals in a similar way to DRAMs. A row address signal is taken out by a row address buffer 106 and is then supplied to a row decoder 105 through a pre-decoder 107. The row decoder 105 is operatively responsive to receipt of the row address signal, for selecting one from among the wordlines WL of the memory cell array 101. A column address signal is taken out of a column address buffer 108 and then passed to the bitline selector 102 for execution of bitline selection.

A bitline BL which is presently selected by the bitline selector 102 is connected through a pre-sense amplifier (PSA) circuit 103 to a main sense amplifier (MSA) circuit 104. This embodiment is featured in that the sense amplifier circuit is made up of the pre-sense amplifier 103 which is disposed in close proximity to the cell array 101 and the main sense amplifier 104 that amplifies an output signal of pre-sense amp 103 in the way stated above, and also in that the presense amp 102 is configured to have a bipolar transistor. Details of these features will be discussed later in the description. It should be noted here that although in the circuitry of FIG. 21 presense amps 103 and main sense amps 104 correspond in number to 1:1, this configuration is modifiable so that a plurality of presense amps 103 commonly use or share a single main sense amp 104.

Write data is supplied from a data input pad Din through an input buffer 109 to a write data line D. The write data on data line D is then passed to a bitline BL which is selected by the bitline selector 102 via the main sense amplifier 104 and presense amplifier 104 operatively associated therewith. Read data is sent forth via read data lines Q, /Q and also via an output buffer 110 and off-chip driver 111 and then output to a data output pad Dout.

The FBC memory chip 100 is provided with other circuits including a controller 112 which generates a variety of kinds of control signals and a voltage generation circuit 113 for generating various internal voltages required.

Figure 1:
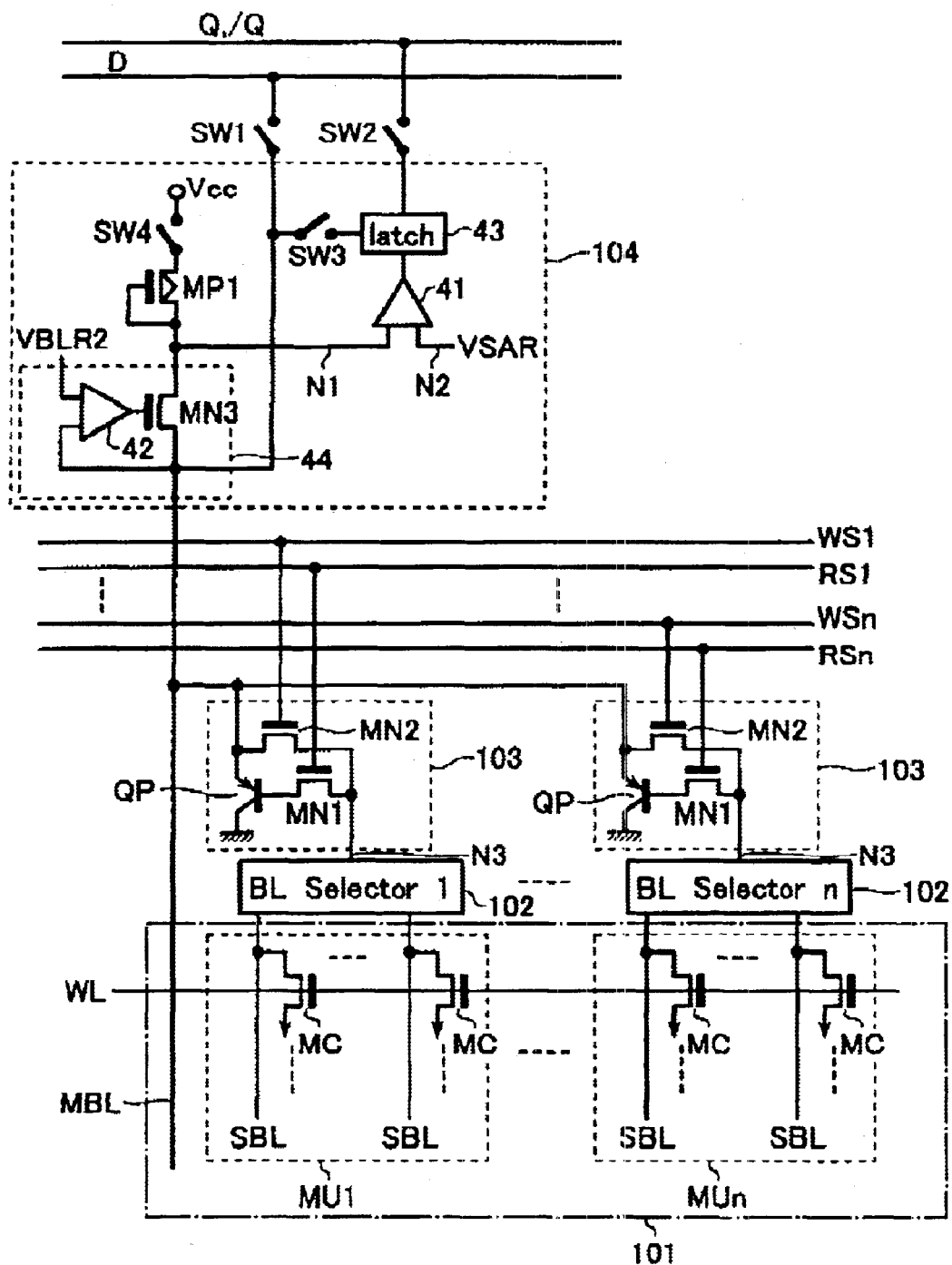
FIG. 1 is a diagram showing a configuration of a sense amplifier circuit of a floating-body cell (FBC) memory chip in accordance with an embodiment of this invention.

Turning to FIG. 1, there is shown a practically implemented configuration of a data sense circuit system used in the FBC memory chip embodying the invention. The circuit configuration shown in FIG. 1 assumes the use of one exemplary scheme for designing the memory cell array 101 so that a main bit line MBL is associated with a plurality of sub-bit lines SBL, which are "slave" lines directly responsive to the main bitline MBL. Further, every group of a prespecified number of ones of the subbit lines SBL makes up a cell unit MUi (i=1, 2, . . . , n, where n is an integer). A plurality of cell units share a single main bitline MBL. A sense amplifier circuit is disposed per each cell unit MUi. The sense amp-circuit is configured from a pre-sense amplifier 103 and a main sense amplifier 104. The pre-sense amp 103 is selectively connectable to its associative subbitline SBL under the control of a bitline selector 102. The main sense amp 104 is connected to main bitline MBL.

The main sense amplifier 104 has an operational amplifier 41 with a sense node N1 and a reference node N2. The sense node N1 is connected to the main bitline MBL through a potential clamping circuit 44. The reference node N2 is for receipt of a reference voltage VSAR as given thereto. The op-amp 41 is operable to amplify a potential difference between the sense node N1 and reference node N2. Sense node N1 is connected to a power supply terminal Vcc through a diode-coupled P-channel MOS (PMOS) transistor MP1 and also via a sense-amp activation switch SW4. PMOS transistor MP1 is for use as a current source load. This load PMOS transistor MP1 may be replaced with a resistive element when the need arises. The reference voltage VSAR given to reference node N2 is at an "intermediate" potential level midway between a read voltage indicative of logic "1" data obtainable at sense node N1 and a read voltage of logic "0" data obtained thereat. A circuit for generation of this reference voltage VSAR will later be set forth in detail.

The clamp circuit 44 is the one that clamps a voltage potential of the main bitline MBL in order to set up a voltage value as given to the drain of a selected memory cell at the time of data reading. Clamp circuit 44 is configured from an NMOS transistor MN3 and an operational amplifier 42. NMOS transistor MN3 is inserted between the sense node N1 and main bitline MBL and serves as a potential damper. Operational amplifier 42 is operable to feed back the voltage of main bitline MBL and control the gate of NMOS transistor MN3. Op-amp 42 has a reference input terminal to which a reference voltage VBLR2 is applied, causing main bitline MBL to be potentially set at VBLR2 during reading.

The op-amp 41 has an output terminal which is connected to a data latch circuit 43. This data latch 43 is for retaining therein read data and write data. Data latch 43 has its node connected to the read-use data lines Q, /Q via a switch SW2 during reading. The node of data latch 43 is also connected to the write-use data line D via switches SW1 and SW3 at the time of write data transfer. During a write operation, the write data that has been loaded into data latch 43 is transferred via switch SW3 toward the main bitline MBL and further sent forth to a selected subbitline SBL via presense amp 103.

This embodiment is arranged to temporarily load the write data into the data latch 43 within main sense amp 104 in the way stated above, but the invention should not exclusively be limited thereto. An example of other approaches is that the write data being supplied to data line D is given directly to main bitline MBL without via data latch 43.

The presense amp 103 provided per each cell unit MUi is arranged to use a PNP bipolar transistor QP. This sense-use transistor QP has a collector coupled to ground, an emitter connected to the main bitline MBL, and a base connected to a circuit node N3 of the bitline selector 102 through an NMOS transistor MN1 for use as a read data transfer gate. NMOS transistor MN1 is selectively driven in a way responding to a select signal RSi (i=1, 2, . . . , n) to turn on during reading. Provided between the node N3 and the emitter of PNP bipolar transistor QP is an NMOS transistor MN2 for use as a transfer gate which transfers, during writing, the write data being supplied to main bitline MBL toward subbitline SBL without passing through transistor QP. During writing, this NMOS transistor MN2 is selectively driven by a select signal WSi (i=1, 2, . . . , n) to turn on. Accordingly, NMOS transistors MN1–MN2 are expected to function as select gates for cell unit selection.

Figure 6:
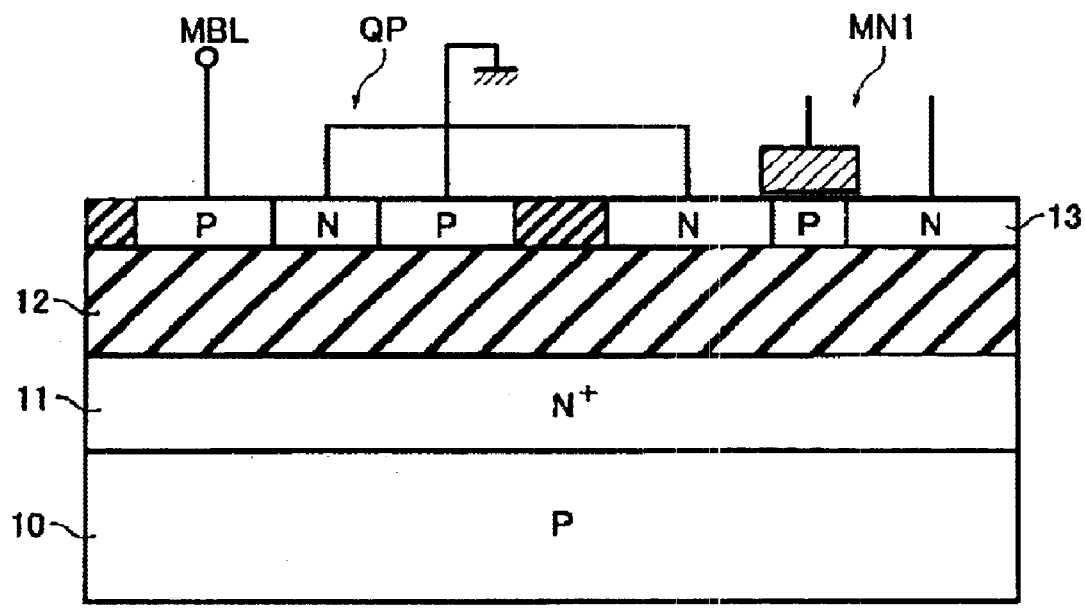
FIG. 6 is a diagram showing a cross-sectional structure of a pre-sense amplifier unit.

The sense-use PNP bipolar transistor QP of presense amp 103 may be a laterally structured or lateral-access transistor which is formed at the silicon layer 13 of SOI substrate. FIG. 6 illustrates, in cross-section, a device structure with this transistor QP and its associated select NMOS transistor MN1 formed together in the SOI substrate's silicon layer 13. The sense amp circuit scheme of FIG. 1 assumes that it is difficult to form the lateral transistor QP at a location between adjacent ones of the closely laid out or "pitched" subbitlines SBL of the memory cell array 101. In consideration of this, the presense amp 103 is disposed per cell unit MUi. If the transistor QP is placed between neighboring subbitlines SBL, then the presense amp 103 may be disposed per each subbitline SBL without the use of any bitline selector 102.

Figure 5:
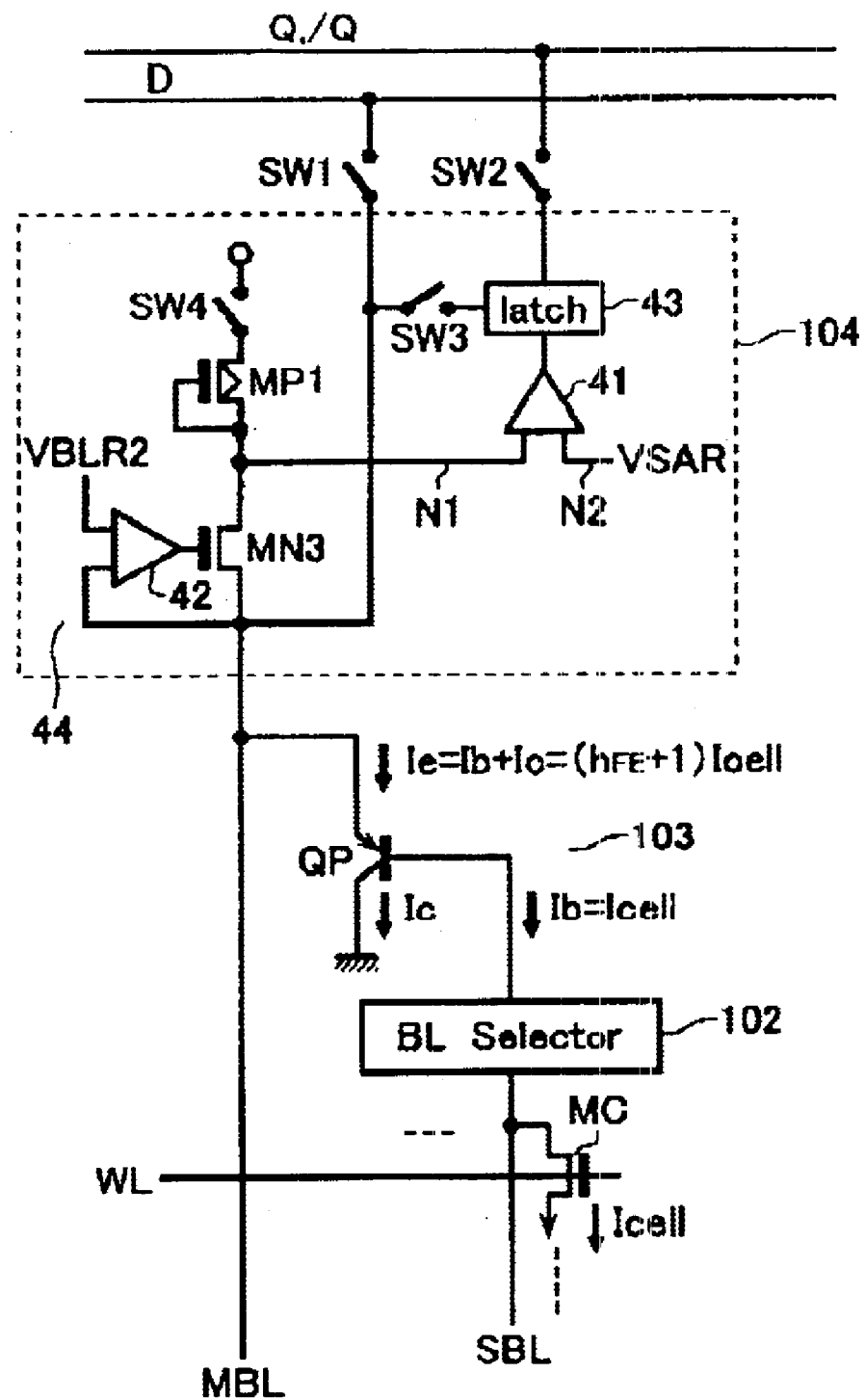
FIG. 5 is a diagram for explanation of an operation of the sense amplifier circuit.

A data read operation of the embodiment memory chip using the sense amplifier circuitry arranged in the way stated above will be explained with reference to FIG. 5. FIG. 5 shows a circuit configuration in such a state that one subbitline SBL is selected by the bitline selector 102 and connected to main bitline MBL through the PNP bipolar transistor QP of presense amp 103. A cell current Icell of a selected memory cell is amplified by transistor QP to provide an amplified current. Due to this amplified current, main bitline MBL is discharged. Whereby, a voltage determined by the cell current is obtained at the sense node N1 which is connected to main bitline MBL via clamping NMOS transistor MN3. The op-amp 41 operates to sense the voltage of sense node N1 by comparison with the reference voltage VSAR applied to reference node N2.

A further detailed explanation is as follows. As shown in FIG. 5, letting the cell current be Icell and the grounded emitter current amplification factor of transistor QP be $h_{FE}$, the transistor QP's emitter current Ie may be represented by the following expression (1).

$$Ie=(h_{FE}+1)Icell \quad (1)$$

A capacitance of the part spanning from the main bitline MBL up to sense node N1 is charged up and discharged by this emitter current Ie. Thus, a time taken from the startup of a data sense operation to final settlement of the voltage of sense node N1 is made shorter in length when compared to the case where the capacitance is charged and discharged by the cell current Icell. Furthermore, a main bitline current increases in magnitude, thereby causing sense node N1 to also increase in voltage amplitude or swing width, resulting in a likewise increase in sense-amp sensitivity. For instance, assuming that the load PMOS transistor MP1 can be approximated by a linear resistance element with a resistance value $R_L$, The sense node N1's voltage $V_{N1}$ is represented as follows:

$$V_{N1}=Vcc-(h_{FE}+1)Icell \cdot R_L \quad (2)$$

where, Vcc is the power supply voltage.

Assuming that cell currents are I1, I0 at when cell data are "1", "0" respectively, voltage difference $\Delta V_{N1}$, which is obtained at the sense node N1 between when logic "1" data is read out and when logic "0" data is read out, is given as the following expression (3).

$$\Delta V_{N1}=(h_{FE}+1)(I1-I0)R_L \quad (3)$$

It is apparent from Equation (3) that the sense-amp sensitivity is improved by the amplification effect of PNP bipolar transistor QP. Additionally, in light of the fact that bipolar transistors have no gates unlike MOS transistors, bipolar transistors are inherently less in variation in device characteristics than MOS transistors. This can be said because bipolar transistors are free from the risk of potential variation otherwise occurring due to such gates. In this point also, the use of bipolar transistors in sense amp circuitry makes it possible to enhance the sensing accuracy or sensitivity thereof.

Using the bipolar transistor OF in the presense amp 103 would result in an increase in electrical power consumption (that is, energy consumed per unit time) because a collector current Ic must flow as shown in FIG. 5. Fortunately, power consumption or dissipation per read cycle will hardly increase impermissibly. In other words the power consumption increase is limited to a practically allowable level. This is because a read time period per se can be shortened in length.

Figure 7:
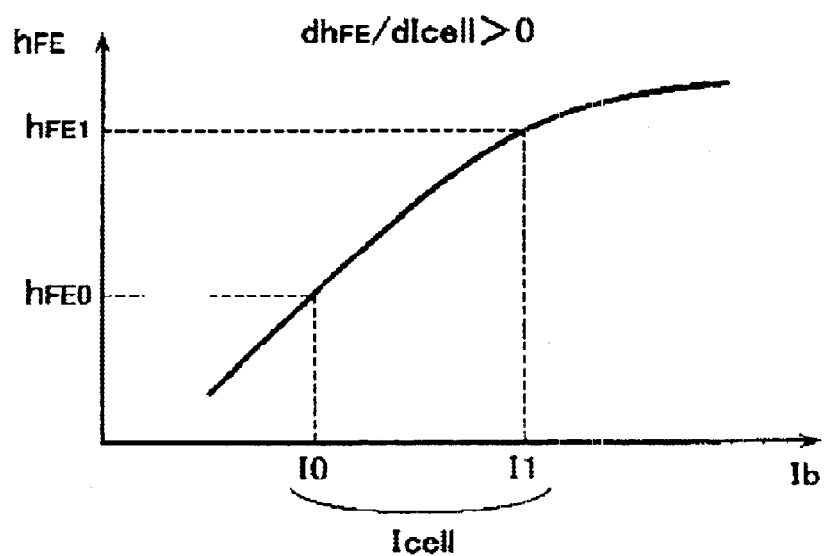
FIG. 7 is a diagram graphically showing a current amplification ratio characteristics curve of a bipolar transistor used in the presense amplifier.

Although in practical applications the current amplification factor $h_{FE}$ is variable in value depending upon the current flowing in the transistor, such current dependency is adjustable by appropriate determination of fabrication process conditions. In order to further improve the sense-amp sensitivity, adjust the transistor characteristics in such a way that the factor $h_{FE}$'s increase rate $dh_{FE}/dIcell$ becomes positive in polarity under read operation conditions as shown in FIG. 7, With such adjustment, the difference of cell current Icell is further amplified at sense node N1. This in turn makes it possible to further improve the sense-amp sensitivity.

As shown in FIG. 19, suppose that the voltage being applied to a selected word line during reading measures 1.5V. Also suppose that the voltage given to the drain of a selected memory cell is set at VBLR=0.2V. In view of the fact that a forward voltage drop with about Vf=0.6V is present between the base and emitter of PNP bipolar transistor QP, it is required that the main bitline MBL is to be set at 0.2+0.6=0.8V. It is the clamp circuit 44 using NMOS transistor MN3 that determines the voltage of main bitline MBL at the time of data reading. The reference voltage VBLR2 that is input to the opamp 42 of clamp circuit 44 is a clamp voltage of main bitline MBL, Thus, let VBLR2=0.8V.

Figure 8:
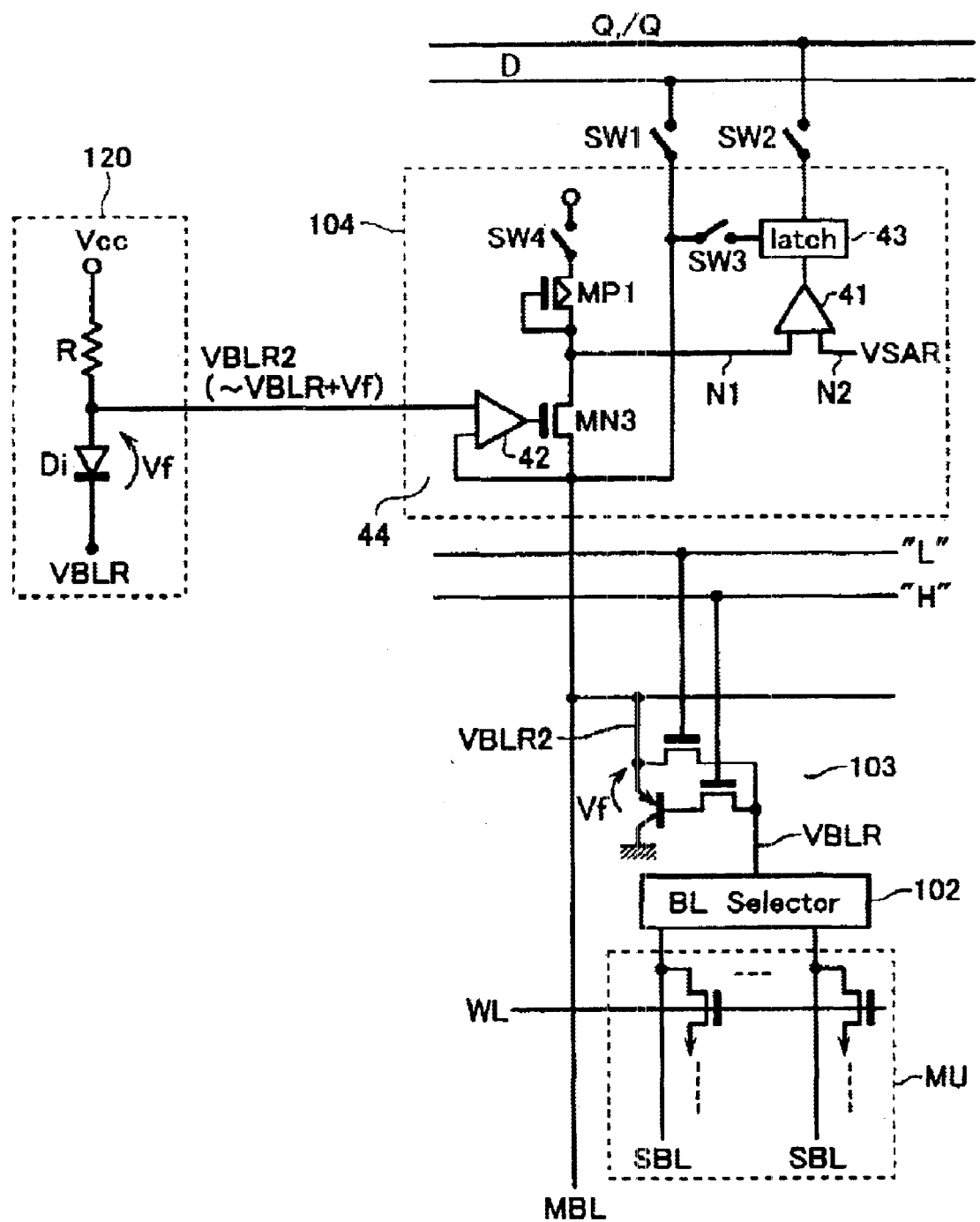
FIG. 8 is a diagram showing a configuration of a reference voltage generation circuit used in a clamp circuit of a main sense amplifier.

Incidentally, the forward voltage drop Vf between the base and emitter of PNP bipolar transistor QP exhibits temperature dependency. In order to set the read voltage VBLR given to the drain of selected memory cell at 0.2V without regard to temperatures, a need is felt to specifically design the circuitry that generates the reference voltage VBLR2 also. See FIG. 8. This diagram shows a configuration of one preferable reference voltage generation circuit 120 adaptable for use with the clamp circuit 44. This reference voltage generator circuit 120 is composed of a serial combination of a diode Di and a resistive element R. Diode Di has a cathode to which the drain voltage VBLR is applied. Diode Di also has its anode to which the resistor R is connected. Resistor R is for use as a current source Load.

The reference voltage VBLR2 that is output from a connection node of the resistor R and diode Di is given as VBLR2=VBLR+Vf, where Vf is the forward voltage drop of diode Di. As the diode Di and the base-emitter junction of PNP bipolar transistor QP are the same as each other in temperature dependency of forward drop voltage, the read voltage VBLR being given to the drain of a selected cell may be constantly set at VBLR=0.2V irrespective of temperatures.

Next, a data write operation will be explained. At the time of data write, load data via a write-use data line D into the latch circuit 43 of main sense amplifier 104 and then transfer the loaded data toward a presently selected sub-bit line. At this time, the write data stored in latch circuit 43 is directly supplied to main bitline MBL without through clamp circuit 44 and then passed to sub-bitline SBL via pre-sense amp 103.

As apparent from FIGS. 17 and 18, the voltage transferred to the subbitline SBL is potentially changeable in a way depending on whether the data of interest is a logic "1" or "0". More specifically the voltage is at 1.5V when the data is logic "1" and at −1V when logic "0". These write-data potential levels are obtainable by appropriate setup of high level side and low level side power supply voltages of the data latch 43. Unfortunately, using NPN bipolar transistor QP in sub-sense amp 103 makes it impossible to transfer a negative voltage from the main bitline MBL to subbitline SBL through this subsense amp 103. This can be said because bipolar transistor QP is reverse-biased between its emitter and base. Another approach to enabling transfer of a 1.5V voltage to the subbitline through transistor QP is to potentially set main bitline MBL at a specified level of 1.5V+Vf. However, this approach is encountered with the risk of a waste shortcircuiting or "shoot-through" current flowing from the emitter to collector of transistor QP. This is not preferable from a viewpoint of power consumption.

To avoid the problem, the FBC memory device embodying the invention is specifically arranged so that an NMOS transistor MN2 is provided for bypassing the write data from the emitter of PNP bipolar transistor QP to the terminal N3 of bitline selector 102 as shown in FIG. 1. During writing, this bypassing NMOS transistor MN2 is selectively driven to turn on in response to a select signal WSi. During writing, let the NMOS transistor MN1 be kept nonconductive—i.e., turn off—causing no current to flow in bipolar transistor QP while at the same time precluding the flow of any shoot-through current between the emitter and collector thereof. In this way, it is possible to perform data write while sending the write data to a selected subbitline SBL.

Figure 9:
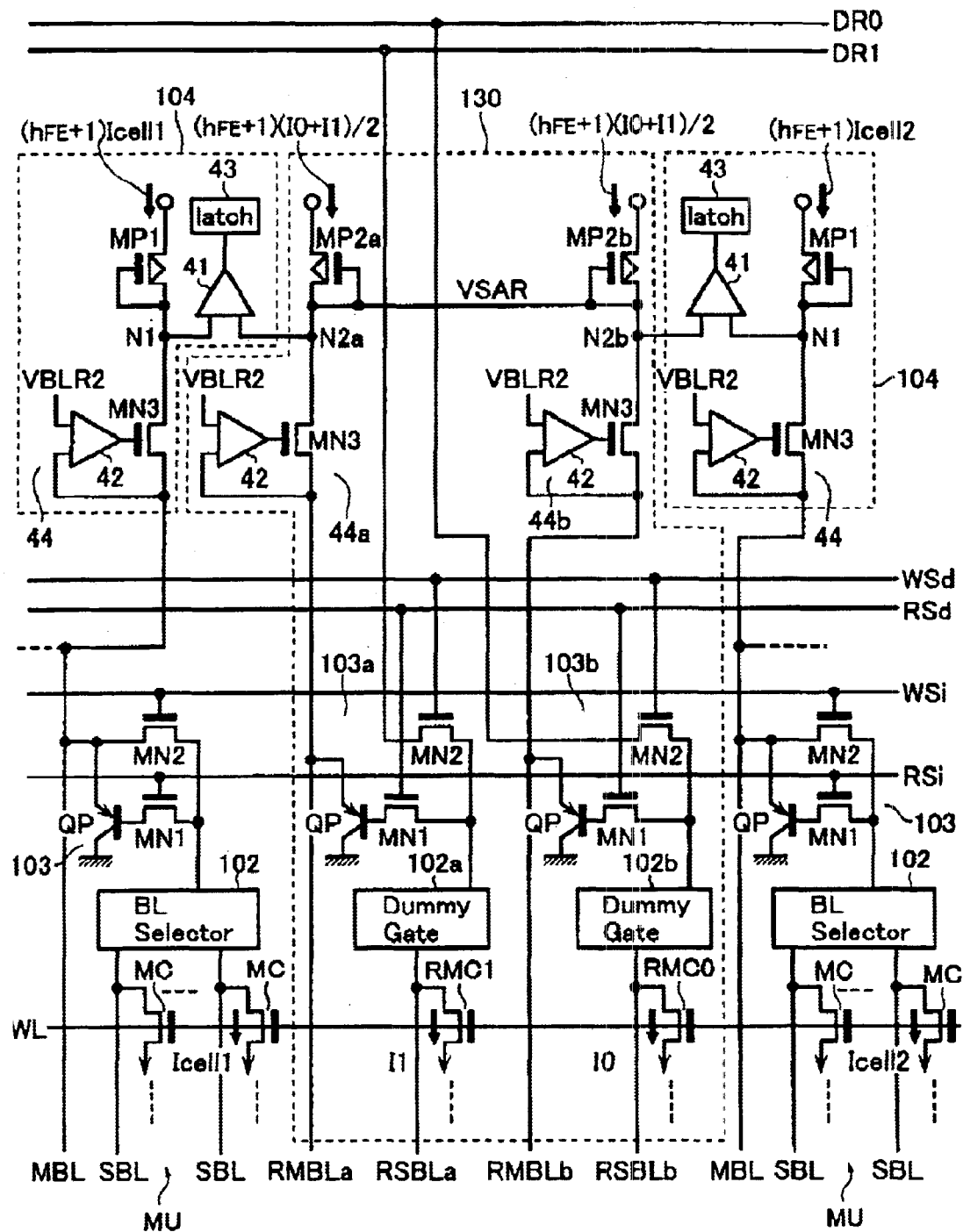
FIG. 9 is a diagram showing a configuration of a reference voltage generator circuit as connected to a reference node of the main sense amplifier.

FIG. 9 shows a configuration of a reference voltage generator circuit 130 which is used for generating the reference voltage VSAR required in the main sense amp 104. It should be required that this reference voltage VSAR be potentially midway between the voltage obtainable at the sense node N1 when the read data is a logic "1" and the voltage when a logic "0". To this end, this embodiment memory chip is arranged to make use of a couple of reference memory cells RMC1 and RMC0. Written into the reference memory cells RMC1 and RMC0 are data "1" and "0", respectively. This voltage generator 130 adds cell currents I1 and I0 of these reference cells RMC1 and RMC0 together to thereby generate the reference voltage VSAR Although in FIG. 9 one specific example is shown with the sense amp circuits of two adjacent cell units MU share the reference voltage generator circuit 130, this circuitry may be modified so that reference voltage generator 130 is shared by an increased number of sense amp circuits when the need arises.

The reference memory cells RMC1 and RMC0 of FIG. 9 are the same in structure as the memory cells MC in the cell units MU and are simultaneously driven by the same word line WL. Reference cell RMC1 and RMC0 are connected to reference sub-bit lines RSBa and RSBb, respectively. The subbitline RSBa is connected through a dummy select gate 102a and reference pre-sense amplifier 103a to a reference main bitline RMBLa. Similarly, the subbitlin RSBb is coupled via a dummy select gate 102b and reference pre-sense amp 103b to a reference main bitline RMBLb. Dummy select gates 102a–102b are specifically designed so that each acts as a load equivalent to the bitline selector 102 when looking at from the sense amp circuit. These dummy select gates 102a–b are formed of gate transistors which are simultaneously driven to turn on during reading. Reference presense amps 103a–b are principally the same in configuration as the presense amp 103. Note however that the NMOS transistors MN2 for write data transfer use are connected to the data lines DR1 and DR2 for reference data write use, rather than to the reference main bitlines RMBLa and RMBLb as shown in FIG. 9.

The two presense amps 103a and 103b include read-use NMOS transistors MN1 respectively. These transistors MN1 are commonly driven by a read select signal RSd. Similarly the write-use NMOS transistors MN2 are commonly driven by a write select signal WSd.

The reference main bitlines RMBLa and RMBLb are connected to reference nodes N2a and N2b of two main sense amps 104 through reference clamp circuits 44a and 44b, respectively. Let reference clamp circuits 44a–44b be the same in configuration as the clamp circuit 44. Reference nodes N2a–N2b are commonly coupled together and virtually serve as a single reference node N2. This node N2 is associated with two diode-coupled PMOS transistors MP2a and MP2b connected thereto. These transistors MP2a–MP2b are for use as current source loads. The load PMOS transistor MP2a, MP2b is the same as the load PMOS transistor MP1 both in size and in current drivability. Optionally these load PMOS transistors PM2a–b may be replaced by a single load PMOS transistor with two times as high current drivability as that of load PMOS transistor MP1 on the sense node N1 side.

With the arrangement above, an "averaged" current flows in the two load PMOS transistors MP2a–MP2b, which current is equal in magnitude to a half (½) of the sum of cell currents of two reference memory cells RMC0–RMC1. Practically FIG. 9 shows currents flowing at the time of data read in conjunction with the reference voltage generator circuit 130 and two sense amp circuits which share this voltage generator 130. More specifically, suppose that a single memory cell is selected from among the cells in one of two cell units MU resulting in flow of a cell current Icell1, whereas a memory cell is selected in the other cell unit MU resulting in flow of a cell current Icell2. At this time, as previously stated, currents defined as $(h_{FE}+1)$Icell1 and $(h_{FE}+1)$Icell2 rush to flow in load PMOS transistors MP1 of corresponding main sense amps 104, respectively.

At this time in the reference voltage generator circuit 130, reference cells RMC1 and RMC0 are selected simultaneously, resulting in cell currents I1 and I0 flowing therein respectively. These cell currents I1–I0 are selected by RSd="H"—namely, when the read select signal RSd is potentially at High or "H" level—and then amplified by reference presense amps 103a–103b and thereafter transferred to the reference nodes N2a–N2b through reference main bitlines RMBLa–RMBLb, respectively. As reference nodes N2a–N2b are commonly coupled together, a current defined by $(h_{FE}+1)(I0+I1)/2$ flows in a respective one of the two load PMOS transistors MP2a–b. Whereby, the intended reference voltage VSAR is obtained at the reference nodes N2a–b. This voltage VSAR has a potential value which is midway between the read voltage of logic "1" data and the read voltage of logic "0" data.

Writing data into the reference memory cells RMC1 and RMC0 is done by simultaneously transferring write data to the reference memory cells RMC1 and RMC0 through data lines DR1 and DR0. More specifically the write voltages of data "1" and "0" being given to the datalines RD1 and RD0 are applied to reference memory cells RMC1 and RMC0 via NMOS transistors MN2 as driven by WSd="H", respectively. With this scheme, data "1" and "0" are written or "programmed" in reference memory cells RMC1–RMC0, respectively.

As apparent from the foregoing discussion, according to this embodiment, it becomes possible to improve the sense-amp sensitivity and also shorten the read time period by amplifying cell currents by presense amplifiers using bipolar transistors. In the illustrative embodiment, the sense amp circuits are each configured from the so-called "BiCMOS" circuitry that uses in combination a bipolar transistor and a complementary MOS (CMOS) circuit. The BiCMOS technology per se is known among those skilled in the semiconductor device art. The technique for using bipolar transistors in sense amp circuitry also is known as stated previously. However, in cases where the BiCMOS technology is applied to memory chips which are fabricated using bulk semiconductors, a remedy for latch-up becomes inevitable. Additionally in order to prevent latch-up, it is required to provide an element isolation region for reliable electrical separation between a bipolar transistor region and a CMOS circuit region, by way of example. Obviously, adding such extra isolation region results in an unwanted increase in on-chip layout area.

In contrast, this embodiment is specifically arranged so that the BiCMOS technology is applied to the FBC memory device using an SOI substrate. As apparent from FIG. 6 also, the use of such SOI substrate permits a bipolar transistor to be electrically isolated and insulated from its surrounding CMOS circuitry. Due to this, the FBC memory is no longer faced with latchup problems and requires no wide element isolation regions. Thus, applying the BiCMOS technology to the FBC memory makes it possible to successfully achieve both higher integration and high-speed performance.

Figure 2:
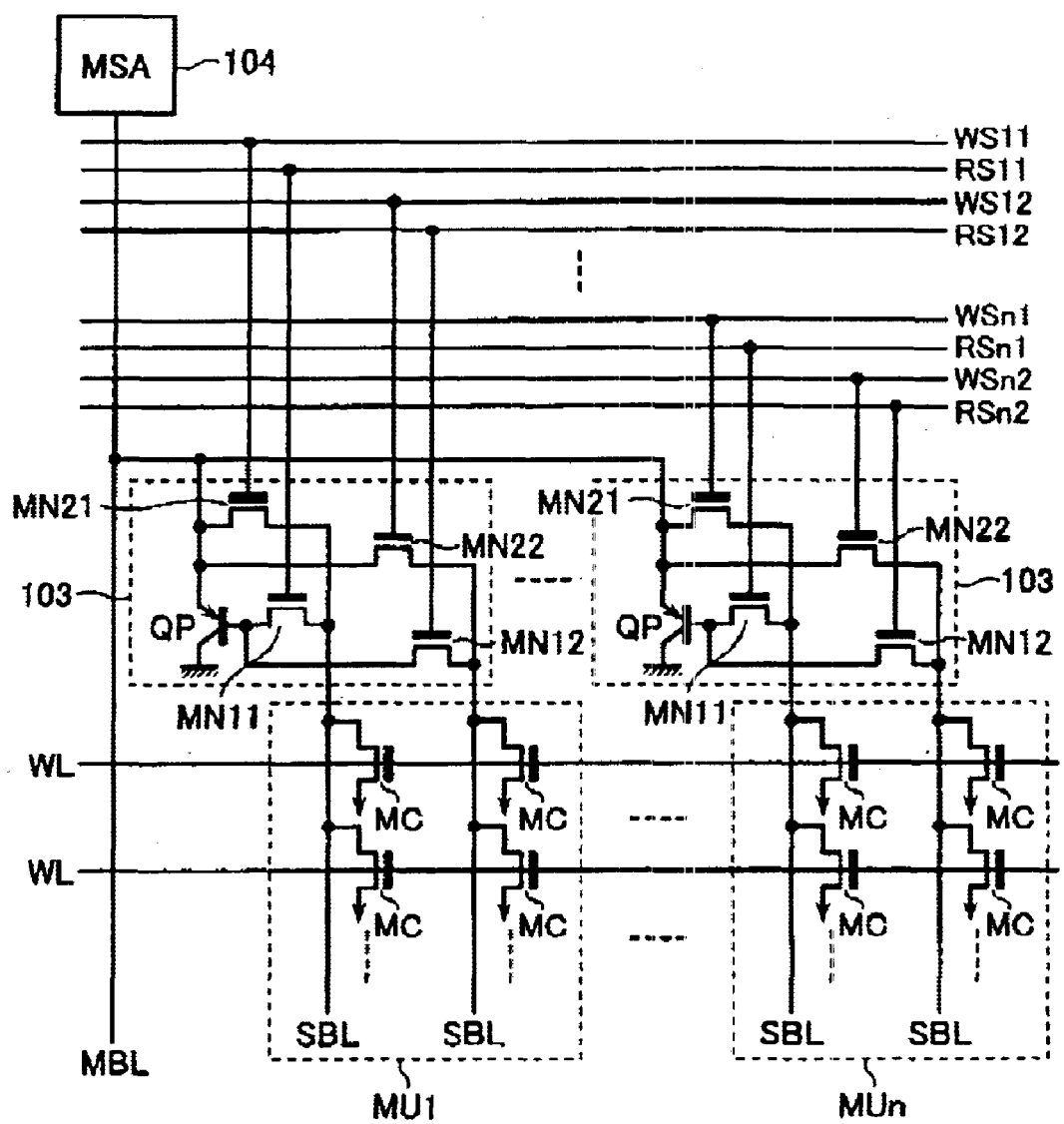
FIG. 2 is a diagram showing another configuration example of the sense amplifier circuit.

Some other configuration examples of the sense amp circuit system will be explained below. FIG. 2 shows an example in which the functionality of the bitline selector 102 used in the sense amp circuit of FIG. 1 is integrally built in a presense amp 103. More specifically, read-use NMOS transistors MN11 and MN12 are provided in each cell unit MUi (i=1, 2, ..., n) so that these are disposed between the base of sense-use PNP bipolar transistor QP and the subbitlines SBL (two in the illustrative example) respectively. These NMOS transistors MN11–MN12 are driven by different read select signals RS—that is, transistor MN11 is driven by a corresponding one of read select signals RS11, ..., RSn1; transistor MN12 is by a signal RS12, ..., RSn2.

Similarly, write-use NMOS transistors MN21 and MN22 are provided in each cell unit MUi so that these are disposed between the main bitline MBL and the subbitlines SBL respectively. These NMOS transistors MN21–MN22 are driven by different write-use select signals WS: transistor MN21 is driven by a write select signal WS11, ..., WSn1; transistor MN22 is by a signal WS12, ..., WSn2.

With such an arrangement, the presense amp 103 is expected to have the bitline selector functionality as built therein.

Figure 3:
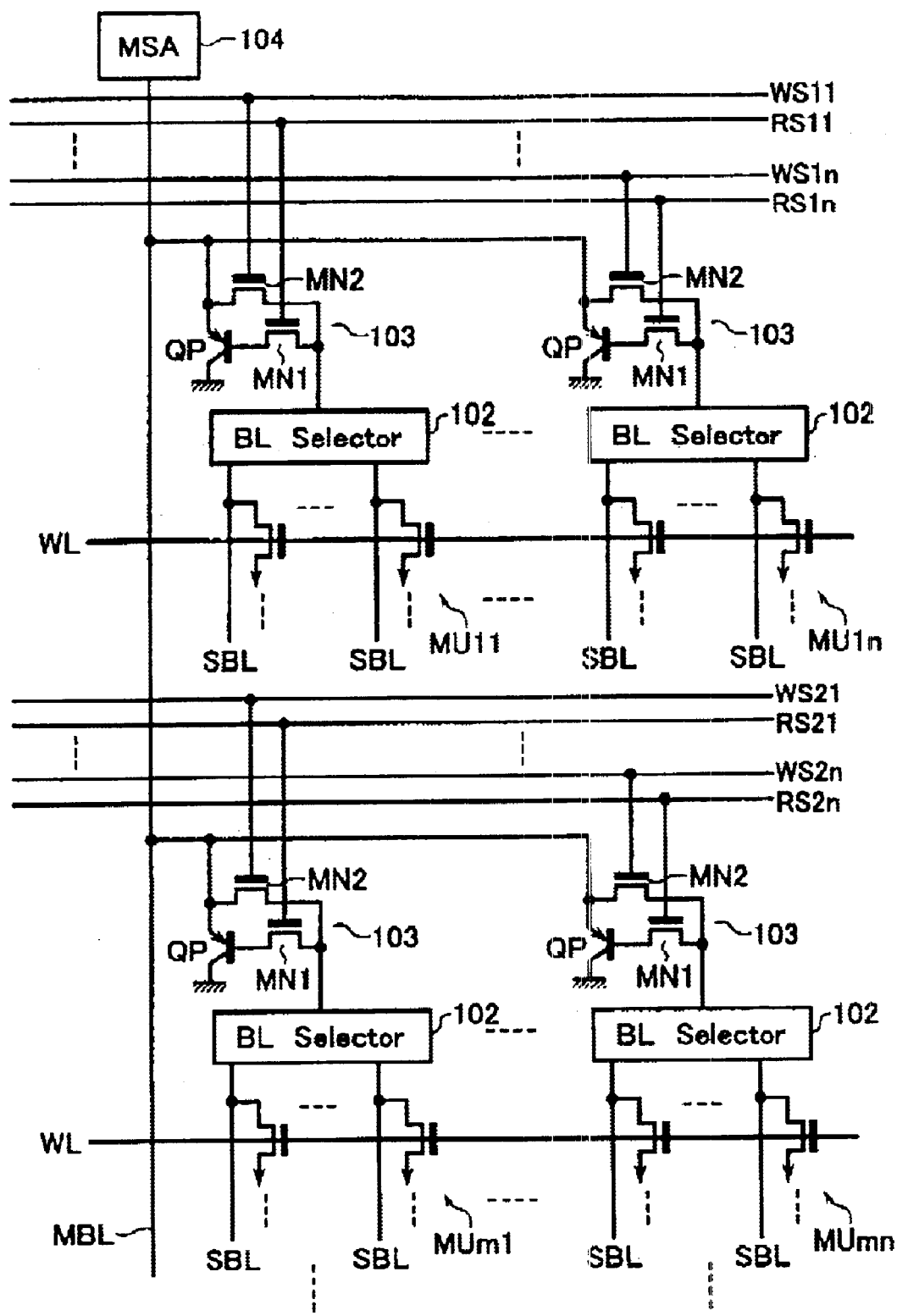
FIG. 3 is a diagram showing still another configuration example of the sense amplifier circuit.

Another exemplary circuit is shown in FIG. 3, which is arranged so that a single main sense amp 104 is operatively associated with a matrix layout of m rows and n columns of cell units MU, where m and n are chosen integers. In this case also, a presense amp 103 is provided per each cell unit MUij (i=1, 2, ..., m; j=1, 2, ..., n).

Figure 4:
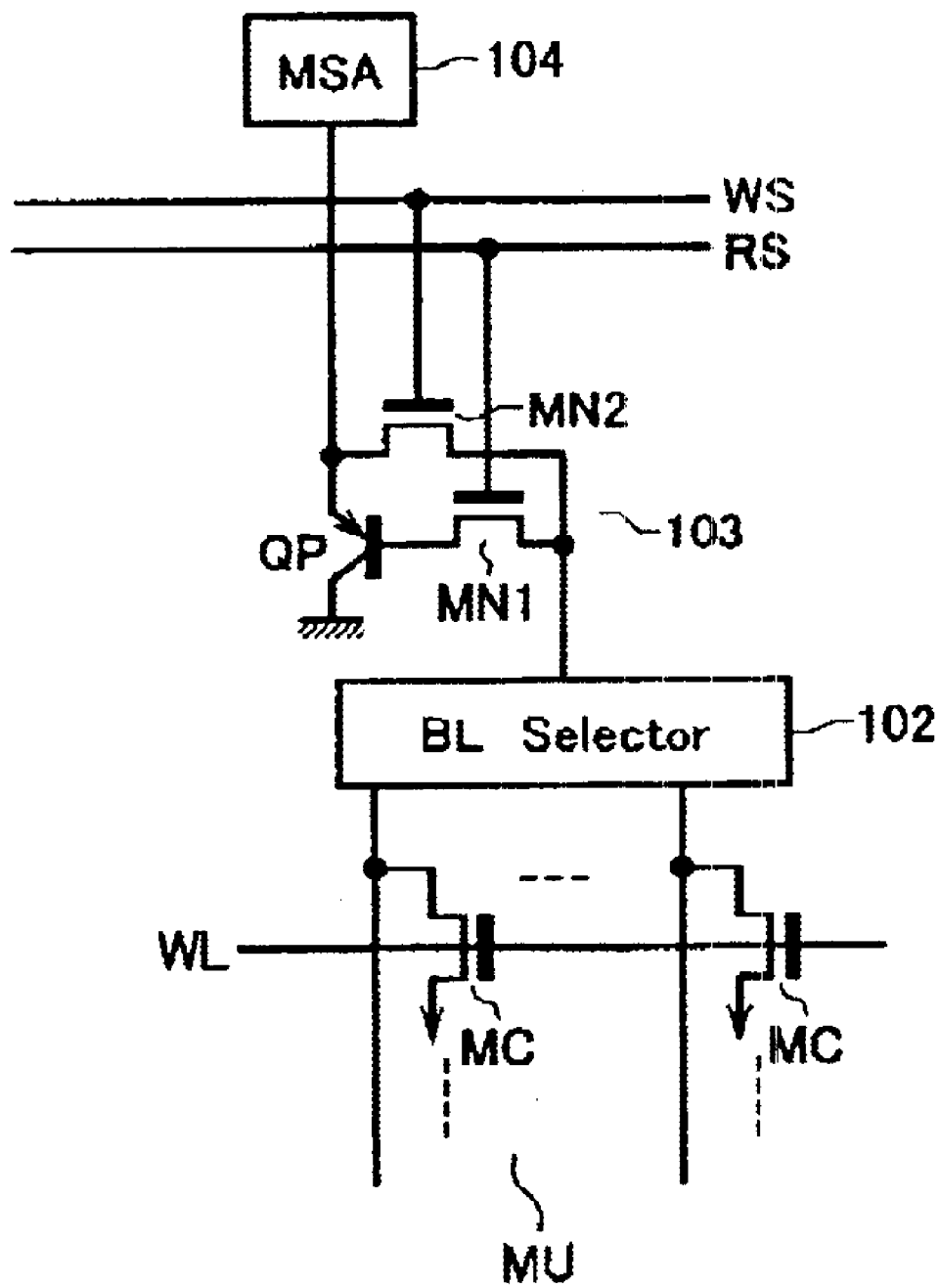
FIG. 4 is a diagram showing yet another configuration example of the sense amplifier circuit.

A still another example is shown in FIG. 4, which is arranged so that a single cell unit MU is associated with a single presense amp 103 and a single main sense amp 104.

Figure 10:
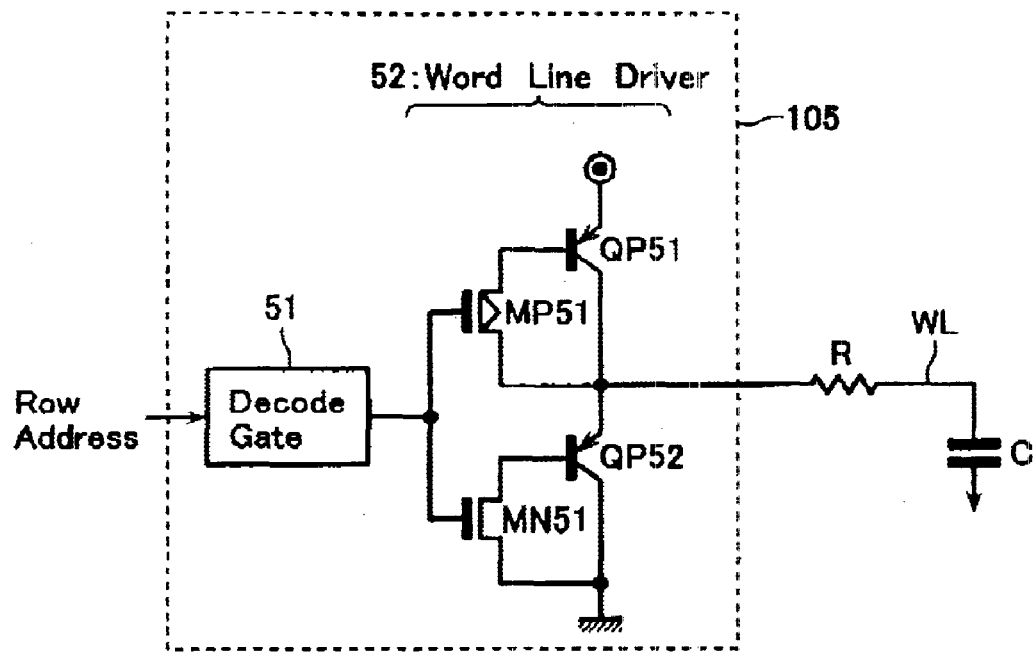
FIG. 10 is a diagram showing an exemplary configuration of a row decoder.
Figure 11:
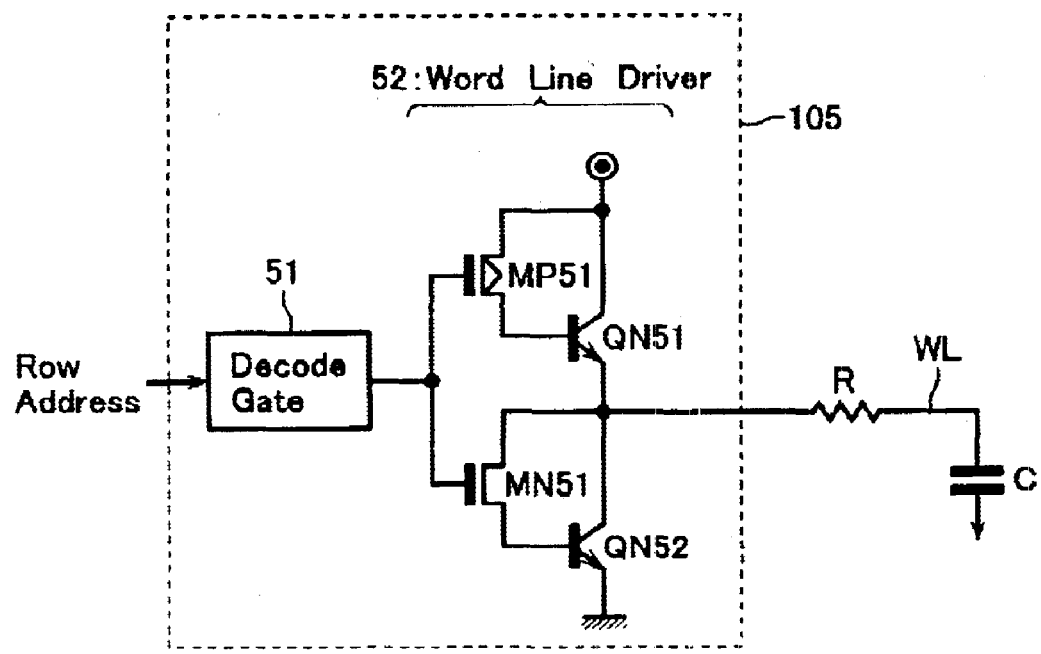
FIG. 11 is a diagram showing another exemplary configuration of the row decoder.

In this invention, it is also useful to apply the BiCMOS technology to circuitry other than the sense amp circuit system. FIGS. 10 and 11 show examples each of which applies the BiCMOS technology to a row decoder 105. Row decoder 105 is made up of a decode gate circuit 51 and a word line driver 52. Wordline driver 52 is responsive to receipt of a decode output signal from decode gate 51 for performing a wordline driving operation.

In an example shown in FIG. 10, the wordline driver 52 includes a pull-up circuit and a pull-down circuit. The pullup circuit is configured from a Darlington connection of a PMOS transistor MP51 and a PNP bipolar transistor QP51. The pulldown circuit is formed of a Darlington connection of an NMOS transistor MN51 and a PNP bipolar transistor QP52. PMOS transistor MP51 is connected between the collector and base of PNP bipolar transistor QP51, whereas NMOS transistor MN51 is between those of PNP bipolar transistor QP52. PMOS and NMOS transistors MP51–MN51 have their gates which are commonly coupled together at a circuit node and are driven by an output signal of the decode gate circuit 51, An example of FIG. 11 is similar to that shown in FIG. 10 with the PNP bipolar transistors QP51 and QP52 being replaced by NPN bipolar transistors QN51 and QN52 in the output circuit thereof. These bipolar transistors QP51–52 and PN51–52 are designed as lateral-access transistors on the silicon layer 13 of SOI substrate in a similar way to that of the sense amp circuit system.

Figure 22:
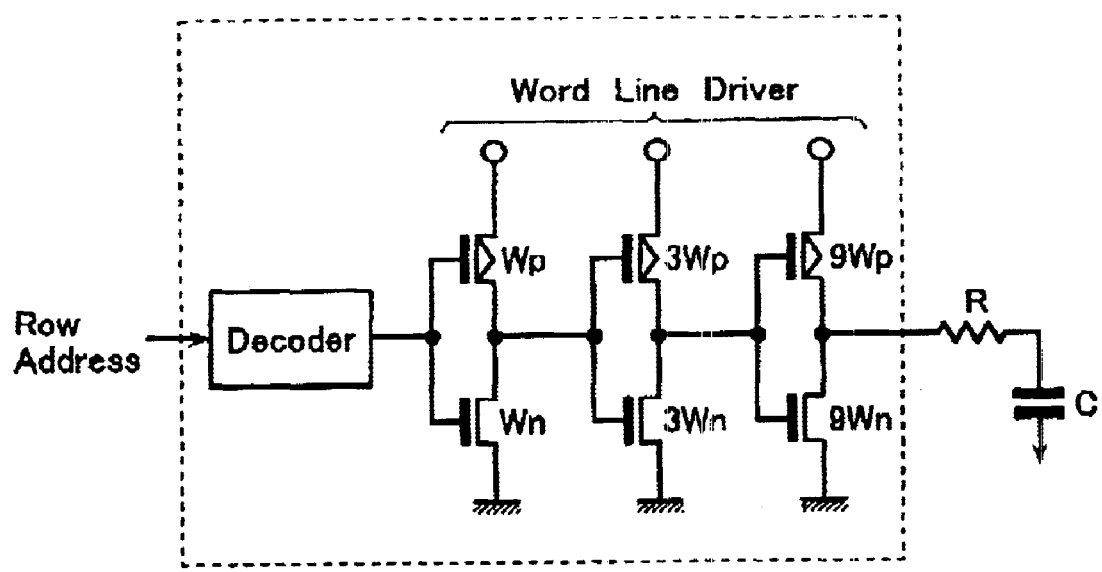
FIG. 22 is a diagram showing a configuration of one prior known row decoder.

As the FBC memory increases in storage capacity, the wordline capacitance becomes larger in value accordingly. In order to drive such capacitance-increased wordlines at high speeds, the wordline driver in a row decoder is required to offer enhanced drivability. When designing the row decoder by using only MOS transistors as in the prior art, a need is felt to design the wordline driver by use of a serial combination of multiple stages of inverters which are gradually enlarged in transistor size as shown in FIG. 22. This multi-stage inverter configuration can result in an increase in consumption of a large chip area.

Unlike the circuit of FIG. 22, the individual one of the examples shown in FIGS. 10–11 employing the BiCMOS technology is capable of obtaining a significant drive current as a result of amplification of drain currents of PMOS and NMOS transistors MP51–MN51 by PNP bipolar transistors QP51–QP52 or alternatively by NPN bipolar transistors QN51–52. Thus it becomes possible to achieve enhanced or maximized high-speed performance of wordline drive while at the same time reducing or minimizing the chip area required for fabrication of wordline drivers, when compared to the case of designing sense amp circuitry using MOS transistors only.

While the invention has been described with reference to the specific embodiment along with some modified examples, the description is illustrative of the invention and is not to be construed as limiting the invention. For example, although in the embodiment the memory cells are each design d to have the NMOS transistor structure, the cell may alternatively be modified to have a PMOS transistor structure. In the case of PMOS transistor structure memory cells, similar results are obtainable by merely rearranging the PMOS and NMOS transistors in respective circuit elements to be opposite in conductivity type to each other while simultaneously replacing the PNP bipolar transistors in presense amps with NPN bipolar transistors, with the voltage relationship being reversed to that in the embodiment stated supra.

This invention may be reduced to practice while permitting various modifications and alterations without departing from the true spirit and scope of the invention as defined by the appended claims.

What is claimed is:

1. A semiconductor memory device comprising:
   a device substrate having a semiconductor layer separated by a dielectric layer from a base substrate:
   a memory cell array having a plurality of memory cells formed and arranged on said semiconductor layer of said device substrate, each said memory cell having a MOS transistor structure with a body in an electrically floating state to store data based on a majority carrier accumulation state of said body: and
   a sense amplifier circuit configured to perform data read out of said memory cell array, including a pre-sense amplifier, the pre-sense amplifier including a bipolar transistor and a main sense amplifier for amplification of an output of said pre-sense amplifier.

2. The semiconductor memory device according to claim 1, wherein
   said bipolar transistor of said pre-sense amplifier is a lateral transistor formed on said semiconductor layer of said device substrate, said lateral transistor having a collector coupled to ground, a base connected to a drain of a corresponding memory cell, and an emitter connected to said main sense amplifier.

3. The semiconductor memory device according to claim 2, wherein
   said lateral transistor has its characteristics that a current amplification factor increases with an increase in base current within an operating current range during reading.

4. The semiconductor memory device according to claim 2, wherein
   said pre-sense amplifier has a first transfer gate for connecting between the base of said lateral transistor and the drain of the corresponding memory cell during reading, and a second transfer gate for transferring write data to the drain of the corresponding memory cell without through said lateral transistor during writing.

5. The semiconductor memory device according to claim 4, wherein
   said first and second transfer gates are MOS transistors.

6. The semiconductor memory device according to claim 1, further comprising:
   a bit-line selector disposed between said pre-sense amplifier and said memory cell array for selecting one from among a plurality of bit lines of said memory cell array and for connecting a selected bit line to said pre-sense amplifier.

7. The semiconductor memory device according to claim 1, wherein
   said main sense amplifier has:
   an operational amplifier having a one input terminal for use as a sense node with cell data transferred thereto and a remaining input terminal as a reference node with a data sensing reference voltage given thereto;
   a first current source load connected to said sense node;
   a first reference voltage generation circuit arranged to include a second current source load connected to said reference node, for generating said data sensing reference voltage; and
   a clamp circuit for clamping during reading a voltage of a bit line of said memory cell array being connected to said sense node.

8. The semiconductor memory device according to claim 7, wherein
   said main sense amplifier further has a data latch connected to an output terminal of said operational amplifier for holding read data.

9. The semiconductor memory device according to claim 8, wherein
   said data latch is used to temporarily hold write data therein.

10. The semiconductor memory device according to claim 7, wherein
    said clamp circuit has:
    a clamping MOS transistor interposed between said sense node and the bit line of said memory cell array;
    an operational amplifier having a one input terminal to which a source voltage of said clamping MOS transistor is fed back and input and a remaining input terminal to which a clamp-use reference voltage is input, for driving by its output a gate of said clamping MOS transistor; and
    a second reference voltage generation circuit for generating said clamp-use reference voltage.

11. The semiconductor memory device according to claim 10, wherein
    said second reference voltage generation circuit comprises a diode whose cathode receives a read voltage to be given to the drain of a memory cell during reading and a current source load connected to an anode of said diode, and generates a clamp-use reference voltage substantially equal in potential to said read voltage plus a forward voltage drop of said diode as added thereto.

12. The semiconductor memory device according to claim 7, wherein
    said first reference voltage generation circuit comprises;
    two reference memory cells with data "0" and "1" being written thereinto, respectively; and two reference pre-sense amplifiers disposed between said reference memory cells and said reference node for performing current amplification of said reference memory cells, respectively; and two reference clamp circuits disposed between said reference memory cells and said reference pre-sense amplifiers, respectively, and wherein said second current source load has two times as high drivability as that of said first current source load.

13. A semiconductor memory device comprising:

a device substrate having a semiconductor layer separated by a dielectric layer from a base substrate;

a memory cell array having a plurality of memory cells formed and arranged on said semiconductor layer of said device substrate, each said memory cell having a MOS transistor structure with a body in an electrically floating state to store data based on a majority carrier accumulation state of said body;

a sense amplifier circuit configured to perform data read out of said memory cell array, said sense amplifier circuit including a bipolar transistor for performing current amplification of a memory cell selected during data reading; and a word-line driver arranged by using a bipolar transistor, for driving a word line connected to the gate of a memory cell in said memory cell array, including a pull-up lateral transistor and a pull-down lateral transistor which are formed at said semiconductor layer of said device substrate.

14. The semiconductor memory device according to claim 13, wherein said word-line driver further comprises:

a P-channel MOS ("PMOS") transistor interposed between a collector and a base of said pull-up lateral transistor; and an N-channel MOS ("NMOS") transistor interposed between a collector and a base of said pull-down lateral transistor and having a gate commonly coupled to a gate of said PMOS transistor.

* * * * *